(12) United States Patent
Pan et al.

(10) Patent No.: US 12,131,972 B2
(45) Date of Patent: Oct. 29, 2024

(54) ELECTRONIC DEVICE

(71) Applicant: Advanced Semiconductor Engineering, Inc., Kaohsiung (TW)

(72) Inventors: Po-Chih Pan, Kaohsiung (TW); Hung-Chun Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 324 days.

(21) Appl. No.: 17/681,695

(22) Filed: Feb. 25, 2022

(65) Prior Publication Data

US 2023/0274998 A1    Aug. 31, 2023

(51) Int. Cl.
| | |
|---|---|
| *H01L 23/367* | (2006.01) |
| *H01L 23/495* | (2006.01) |
| *H01L 23/538* | (2006.01) |
| *H01L 25/065* | (2023.01) |
| *H01L 25/18* | (2023.01) |

(52) U.S. Cl.
CPC ...... *H01L 23/367* (2013.01); *H01L 23/49568* (2013.01); *H01L 23/49575* (2013.01); *H01L 23/5384* (2013.01); *H01L 25/0657* (2013.01); *H01L 25/18* (2013.01)

(58) Field of Classification Search
CPC ............. H01L 23/367; H01L 23/49568; H01L 23/49575; H01L 23/5384; H01L 25/18; H01L 25/50
See application file for complete search history.

(56) References Cited

U.S. PATENT DOCUMENTS

| | | | |
|---|---|---|---|
| 2016/0050744 A1* | 2/2016 | Lee ...................... | H01L 23/3677 361/712 |
| 2021/0328551 A1* | 10/2021 | Maalouf ................. | H01L 23/36 |
| 2023/0275000 A1* | 8/2023 | Hung ................... | H01L 23/5387 257/621 |
| 2024/0008184 A1* | 1/2024 | Kuo ....................... | H05K 1/185 |

* cited by examiner

*Primary Examiner* — Thao P Le
(74) *Attorney, Agent, or Firm* — FOLEY & LARDNER LLP

(57) ABSTRACT

An electronic device is disclosed. The electronic device includes an active component, a power regulating component disposed on the active component, and a patterned conductive element disposed between the active component and the power regulating component. The patterned conductive element is configured to provide one or more heat dissipation paths for the active component and to provide a power path between the active component and the power regulating component.

7 Claims, 20 Drawing Sheets

ELECTRONIC DEVICE

BACKGROUND

1. Field of the Disclosure

The present disclosure generally relates to an electronic device.

2. Description of the Related Art

A power regulating component can be integrated within a package to provide power control for components in the package. The power routing path for the power regulating component is usually provided by a substrate and/or package routing features (such as conductive vias and pads) in the package, and thus the package size inevitably increases. In addition, the heat dissipation issue may become severe if more components are integrated into the package.

SUMMARY

In some embodiments, an electronic device includes an active component, a power regulating component disposed on the active component, and a patterned conductive element disposed between the active component and the power regulating component. The patterned conductive element is configured to provide one or more heat dissipation paths for the active component and to provide a power path between the active component and the power regulating component.

In some embodiments, an electronic device includes an active component, a power regulating component disposed on the active component, and a heat dissipation element disposed between the active component and the power regulating component and configured to provide heat dissipation for the active component. The electronic device also includes a conductive element physically spaced apart from the heat dissipation element and configured to provide multiple power signals from the power regulating component to the active component.

In some embodiments, an electronic device includes an active component, a power regulating component disposed on the active component, and a lead frame disposed between the active component and the power regulating component. The power regulating component is configured to provide power to the active component through the lead frame and a backside surface of the active component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
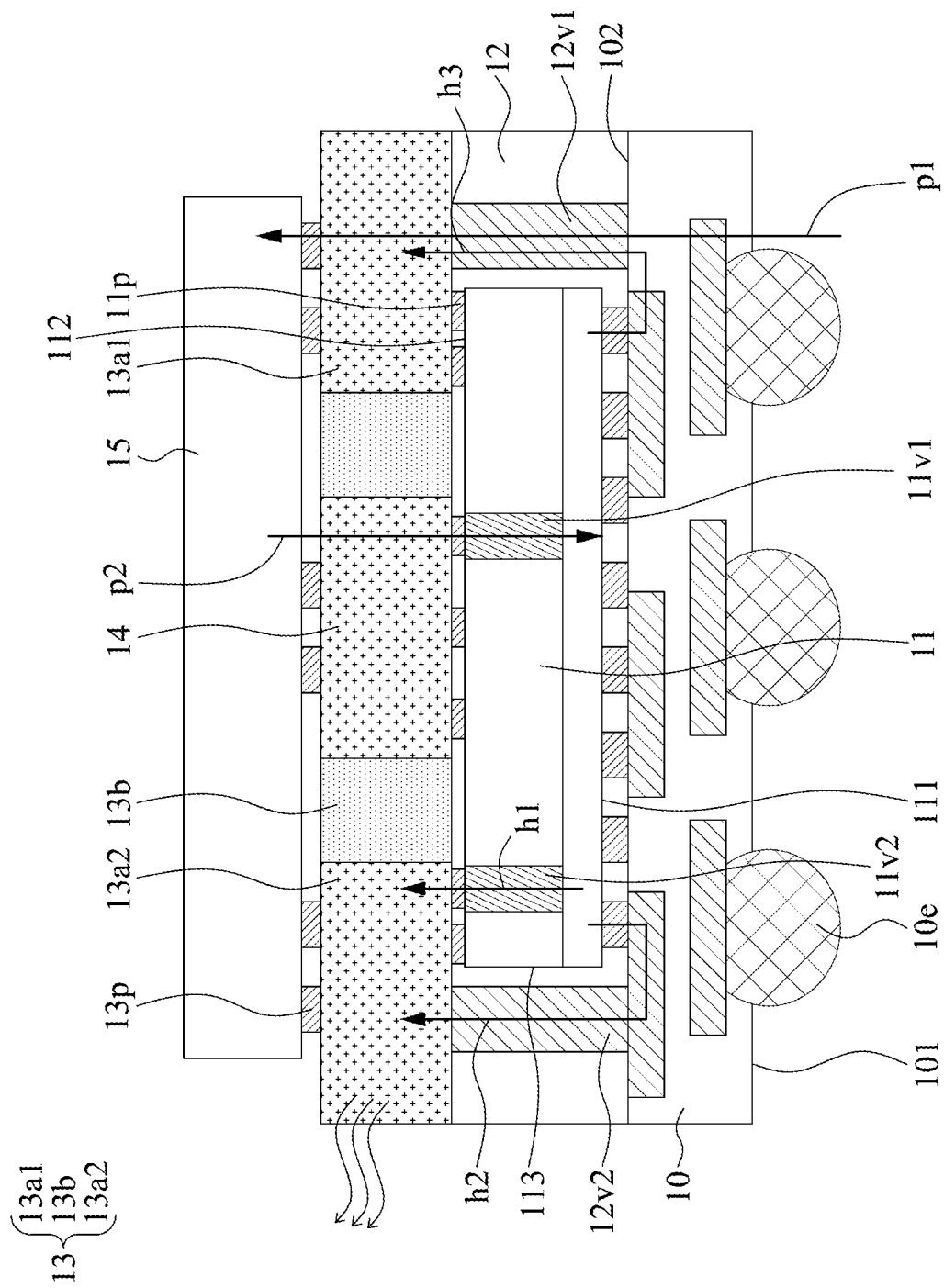
FIG. 1A illustrates a cross-sectional view of an example of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a cross-sectional view of an example of an electronic device 1 according to some embodiments of the present disclosure. In some embodiments, the electronic device 1 may include a package, such as a semiconductor device package. In some embodiments, the electronic device 1 may include a carrier 10, an active component 11, an encapsulant 12, a patterned conductive element 13, a conductive element 14, and a power regulating component 15.

In some embodiments, the carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include an interconnection structure, such as a redistribution layer (RDL), a circuit layer, a conductive trace, a conductive via, etc.

The carrier 10 may include a surface 101 and a surface 102 opposite to the surface 101. The carrier 10 may include one or more conductive pads (not shown) in proximity to, adjacent to, or embedded in and exposed from the surface 101 and/or 102 of the carrier 10. The carrier 10 may include a solder resist (not shown) on the surface 101 and/or 102 of the carrier 10 to fully expose or to expose at least a portion of the conductive pads for electrical connections of the electronic device 1.

In some embodiments, an electrical contact 10e may be disposed on the surface 101 of the carrier 10 and can provide electrical connections between the electronic device 1 and external components (e.g., external circuits or circuit boards). In some embodiments, the electrical contact 10e may include a connector. In some embodiments, the electrical contact 10e may include a solder ball, such as a controlled collapse chip connection (C4) bump, a ball grid array (BGA) or a land grid array (LGA).

The active component 11 may be disposed on the surface 102 of the carrier 10. In some embodiments, the active component 11 may be electrically connected with the carrier 10 through an electrical contact, such as solder balls.

In some embodiments, the active component 11 may be circuits or circuit elements that rely on an external power supply to control or modify electrical signals. For example, the active component 11 may include a processor, a controller, a memory, or an input/output (I/O) buffer, etc. For example, the active component 11 may include a system on chip (SoC). For example, the active component 11 may include a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit.

The active component 11 may include a surface 111 facing the carrier 10, a surface 112 opposite to the surface 111, and a lateral surface 113 extending between the surface 111 and the surface 112. The surface 112 may face the patterned conductive element 13, the conductive element 14, and the power regulating component 15. In some embodiments, the surface 111 may include an active surface and the surface 112 may include a backside surface.

In some embodiments, the active component 11 may include one or more conductive vias $11v1$ and $11v2$ extending between the surface 111 and the surface 112 for providing power and/or grounding connections. For example, the conductive via $11v1$ may be configured to receive a power signal from the power regulating component 15, and the conductive via $11v2$ may be configured to connect the power regulating component 15 to a reference voltage or a grounding voltage. The connections of the conductive vias $11v1$ and $11v2$ are further described below. The locations and the numbers of the conductive vias in the active component 11 may be adjusted according to design requirements and are not limited to the specific examples shown in the figures.

The encapsulant 12 may be disposed on the surface 102 of the carrier 10 to cover or encapsulate the active component 11. In some embodiments, the encapsulant 12 may cover or encapsulate one or more lateral surfaces (which may extend between the surface 111 and the surface 112) of the active component 11. The encapsulant 12 may be connected with the patterned conductive element 13. The encapsulant 12 may be in contact with the patterned conductive element 13.

In some embodiments, the encapsulant 12 may include an epoxy resin having fillers, a molding compound (e.g., an epoxy molding compound or another molding compound), a polyimide, a phenolic compound or material, a material with a silicone dispersed therein, or a combination thereof.

In some embodiments, one or more conductive vias $12v1$ and $12v2$ may extend through the encapsulant 12 for providing power and/or grounding connections. The conductive vias $12v1$ and $12v2$ may be spaced apart from the lateral surface 113 of the active device 11.

For example, the conductive via $12v1$ may be configured to receive a power signal from the carrier 10, and the conductive via $12v2$ may be configured to connect the power regulating component 15 to a reference voltage or a grounding voltage. The power paths provided by the conductive vias $12v1$ and $12v2$ may pass by the lateral surface 113 of the active device 11. The power paths provided by the conductive vias $12v1$ and $12v2$ may extend along the lateral surface 113 of the active device 11. The power paths provided by the conductive vias $12v1$ and $12v2$ may be adjacent to the lateral surface 113 of the active device 11. The power paths provided by the conductive vias $12v1$ and $12v2$ may not pass through the active device 11. The power paths provided by the conductive vias $12v1$ and $12v2$ may be outside of the active device 11. The connections of the conductive vias $12v1$ and $12v2$ are further described below. The locations and the numbers of the conductive vias in the encapsulant 12 may be adjusted according to design requirements and are not limited to the specific examples shown in the figures.

In some embodiments, the conductive vias $12v1$ and $12v2$ may each be surrounded by the encapsulant 12. In some embodiments, the conductive vias $12v1$ and $12v2$ may each be disposed adjacent to the active device 11. In some embodiments, the conductive vias $12v1$ and $12v2$ may each be spaced apart from the active device 11.

The patterned conductive element 13 may be disposed on the surface 112 of the active device 11 and the encapsulant 12. The patterned conductive element 13 may be disposed between the active device 11 and the power regulating component 15. In some embodiments, the patterned conductive element 13 may be configured to support the power regulating component 15 over the active component 11. For example, the power regulating component 15 may be spaced apart from the active component 11 by the patterned conductive element 13.

In some embodiments, any two of the active component 11, the patterned conductive element 13, and the power regulating component 15 may be partially overlapping in a direction perpendicular to the surface 101 and/or the surface 102 of the carrier 10.

In some embodiments, the patterned conductive element 13 may be electrically connected to the carrier 10 through the conductive vias $12v1$ and $12v2$. In some embodiments, the patterned conductive element 13 may be electrically connected to the active component 11 through an electrical contact, such as solder balls. In some other embodiments, the patterned conductive element 13 may directly contact or connect to the active component 11.

In some embodiments, the power regulating component 15 may be electrically connected to the carrier 10 through the patterned conductive element 13 and the conductive vias $12v1$ and $12v2$. In some embodiments, the power regulating component 15 may be electrically connected to the active component 11 through the patterned conductive element 13.

In some embodiments, the patterned conductive element 13 may include conductive elements 13a1 and 13a2 spaced part from each other. For example, the conductive element 13a1 is physically spaced apart from the conductive element 13a2. For example, the conductive element 13a1 is physically separated from the conductive element 13a2. For example, an insulating element 13b may be interposed between the conductive elements 13a1 and 13a2.

In some embodiments, the insulating element 13b may be physically spaced apart from the encapsulant 12. However, in some other embodiments, the insulating element 13b may be connected with the encapsulant 12. For example, the insulating element 13b may be in contact with the encapsulant 12.

In some embodiments, the patterned conductive element 13 may extend over and beyond the one or more lateral surfaces of the active component 11. For example, the conductive element 13a1 and the conductive element 13a2 may extend from the active component 11 in opposite directions. For example, the conductive element 13a1 may extend over and beyond a lateral surface of the active component 11 and the conductive element 13a2 may extend over and beyond an opposite lateral surface of the active component 11. For example, the conductive element 13a1 may extend over the conductive via 12v1 and contact the conductive via 12v1. For example, the conductive element 13a2 may extend over the conductive via 12v2 and contact the conductive via 12v2.

The conductive element 14 may be disposed between the active component 11 and the power regulating component 15. The conductive element 14 may be disposed between the conductive elements 13a1 and 13a2. The conductive element 14 may be spaced apart from the conductive elements 13a1 and 13a2. For example, the conductive element 14 may be physically spaced apart from the conductive elements 13a1 and 13a2. For example, the conductive element 14 may be physically separated from the conductive elements 13a1 and 13a2. For example, the insulating element 13b may be interposed between the conductive element 14 and the conductive element 13a1 and between conductive element 14 and the conductive element 13a2.

In some embodiments, the conductive element 14 may be electrically connected to the active component 11 through an electrical contact, such as solder balls. In some other embodiments, the conductive element 14 may directly contact or connect to the active component 11.

In some embodiments, the power regulating component 15 may be electrically connected to the active component 11 through the conductive element 14.

Figure 1B:
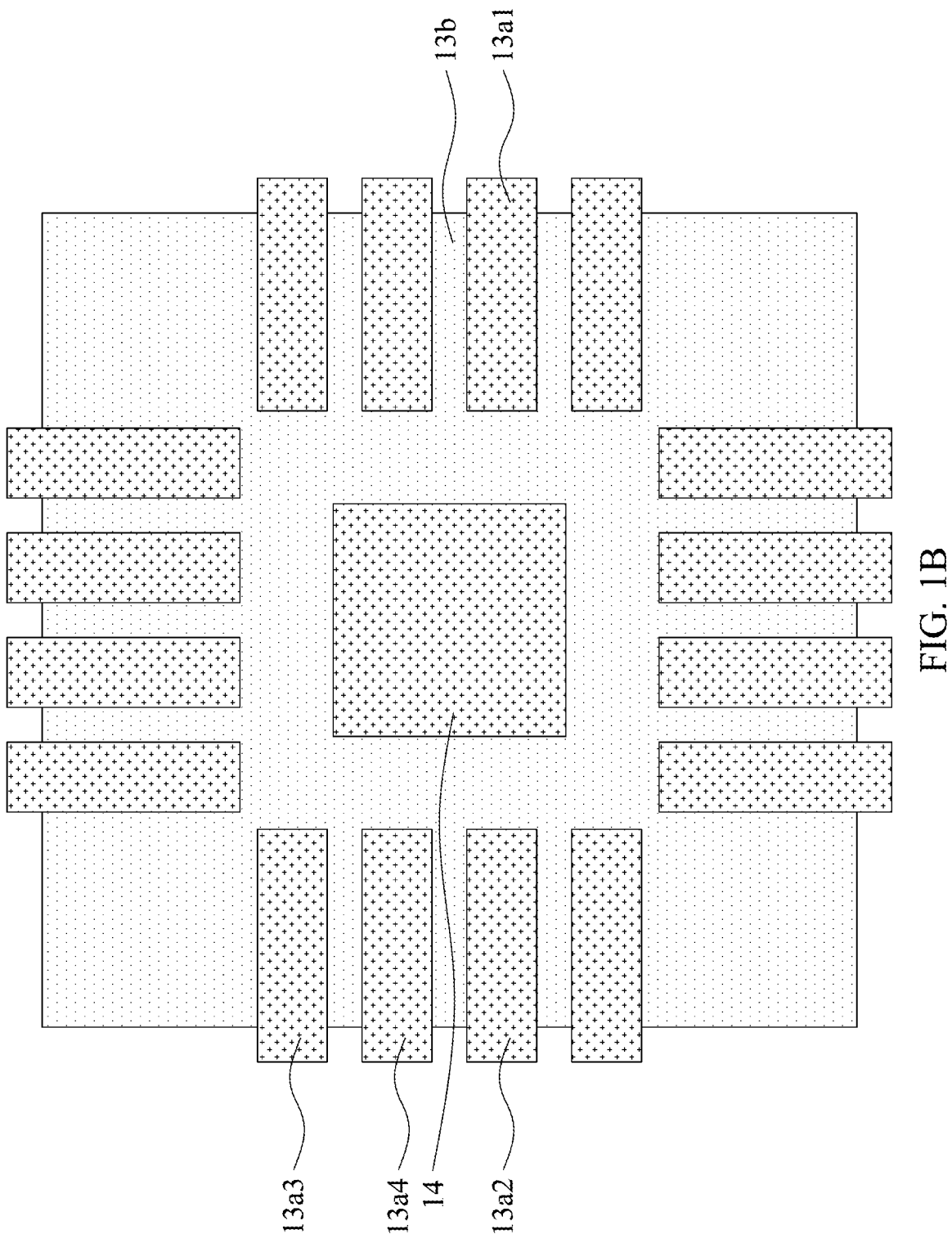
FIG. 1B illustrates a top view of an example of a part of an electronic device according to some embodiments of the present disclosure.

Referring to FIG. 1B, it illustrates a top view of an example of a part of an electronic device according to some embodiments of the present disclosure. In some embodiments, the top view of FIG. 1B may be a top view of the patterned conductive element 13 and the conductive element 14 of the electronic device 1.

In some embodiments, the conductive element 14 may be a part of the patterned conductive element 13. For example, the conductive element 14 may be seen as one of the conductive elements of the patterned conductive element 13. For example, the conductive element 14 and the conductive elements 13a1 and 13a2 may be made from the same material.

In some embodiments, the conductive elements 13a1 and 13a2, the conductive element 14, and other conductive elements may be attached, connected, or combined with one another through the insulating element 13b. In some embodiments, the insulating element 13b may be configured to support the conductive elements of the patterned conductive element 13.

In some embodiments, the patterned conductive element 13 may be a lead frame or a part thereof. For example, the conductive elements (including the conductive elements 13a1 and 13a2) arranged on the periphery of the insulating element 13b may be leads or lead pads of the lead frame. The conductive elements arranged on the periphery may be configured to transmit the power signal p1. The conductive element 14 may be the central die pad of the lead frame. The conductive element on the central die pad (i.e., the conductive element 14) may be configured to transmit the power signal p2.

In some embodiments, the conductive elements arranged on the periphery may be configured to transmit the power signal p1 (from the carrier 10 to the power regulating component 15) and the power signal p2 (from power regulating component 15 to the active component 11). For example, a conductive element 13a3 may be configured to transmit the power signal p1 to the power regulating component 15 and a conductive element 13a4 may be configured to transmit the power signal p2 to the active component 11.

In some embodiments, the conductive elements of the patterned conductive element 13 may each include a conductive material such as a metal or metal alloy. Examples of the conductive material include copper (Cu), magnesium (Mg), nickel (Ni), silver (Ag), other metal(s) or alloy(s), or a combination of two or more thereof.

Referring back to FIG. 1A, the power regulating component 15 may be disposed on the patterned conductive element 13 and the conductive element 14. In some embodiments, the power regulating component 15 may be electrically connected with the patterned conductive element 13 and the conductive element 14 through an electrical contact, such as solder balls.

In some embodiments, the power regulating component 15 may include a power management integrated circuit (PMIC). In some embodiments, the power regulating component 15 may include a voltage regulator, such as a linear regulator (which is configured to maintain a constant output voltage) or a switching regulator (which is configured to generate an output voltage higher than or lower than an input voltage). In some embodiments, the power regulating component 15 may include a step-down (buck) converter, a step-up (boost) converter, an analog-to-digital converter, a digital-to-analog converter, an AC-DC converter, a DC-DC converter, other types of converters, or a combination thereof.

In some embodiments, the power regulating component 15 may be configured to receive a power signal p1 (or an input power) from the patterned conductive element 13 and generate a power signal p2 (or an output power or a regulated power) for the active component 11 through the conductive element 14.

In some embodiments, the electrical contact 10e (or another connector) may be configured to be electrically connected with a power source or a power supply (not illustrated in the figures). The power signal p1 from the power supply may be transmitted to the power regulating component 15 through a power routing path (or a power path) provided by the carrier 10, the conductive via 12v1, and the patterned conductive element 13.

The power regulating component 15 may receive the power signal p1 and generate the power signal p2 for the active component 11. The power signal p2 from the power regulating component 15 may be transmitted to the active component 11 through a power path provided by the conductive element 14 and the conductive via 11v1. The power path of the power p2 may be between the conductive elements 13a1 and 13a2. The power signal p2 may pass through the backside surface (e.g., the surface 112) of the active component 11. In some embodiments, the conductive via 11v1 may be electrically connected with the conductive element 14. In some embodiments, the conductive via 11v1 may be configured to receive the power signal p2.

According to some embodiments of the present disclosure, by providing the power signal p2 through the backside surface (e.g., the surface 112) of the active component 11, the power signal p2 can be transmitted to the active component 11 without consuming input/output (I/O) pins on the active surface (e.g., the surface 111) of the active component 11, and thus more I/O pins can be used to transmit signals. Therefore, the performance of the electronic device 1 can be enhanced.

In addition, the patterned conductive element 13 and the conductive element 14 may include heat dissipation elements. The patterned conductive element 13 and the conductive element 14 can not only dissipate heat from the power regulating component 15 and the active component 11, but also provide power and/or grounding connections. For example, the patterned conductive element 13 may be configured to transmit the power signal p1 to the power regulating component 15, and the conductive element 14 may be configured to transmit the power signal p2 to the active component 11. Therefore, the size of the electronic device 1 can be reduced, and the heat dissipation issue can be alleviated or solved.

For example, a heat dissipation path h1 may be provided by the conductive via 11v2 and the conductive elements of the patterned conductive element 13 (such as the conductive elements 13a1 and 13a2 or other conductive elements in FIG. 1B). Heat from the active surface (e.g., the surface 111) of the active component 11 can be dissipated through the conductive via 11v2 (functioned as a thermal via) and the conductive elements of the patterned conductive element 13.

In some embodiments, a heat dissipation path h2 may be provided by the electrical contacts of the active component 11, the carrier 10, and the conductive via 12v2. Heat from the active surface (e.g., the surface 111) of the active component 11 can be dissipated through the electrical contacts of the active component 11, the carrier 10, and the conductive via 12v2.

In some embodiments, a heat dissipation path h3 may be provided by the electrical contacts of the active component 11, the carrier 10, and the conductive via 12v1. Heat from the active surface (e.g., the surface 111) of the active component 11 can be dissipated through the electrical contacts of the active component 11, the carrier 10, and the conductive via 12v1.

In some embodiments, to reduce unwanted currents, the conductive via 11v2 may be configured to connect the power regulating component 15 to a reference voltage or a grounding voltage. Alternatively or additionally, the conductive via 12v2 may be configured to connect the power regulating component 15 to a reference voltage or a grounding voltage.

Figure 2A:
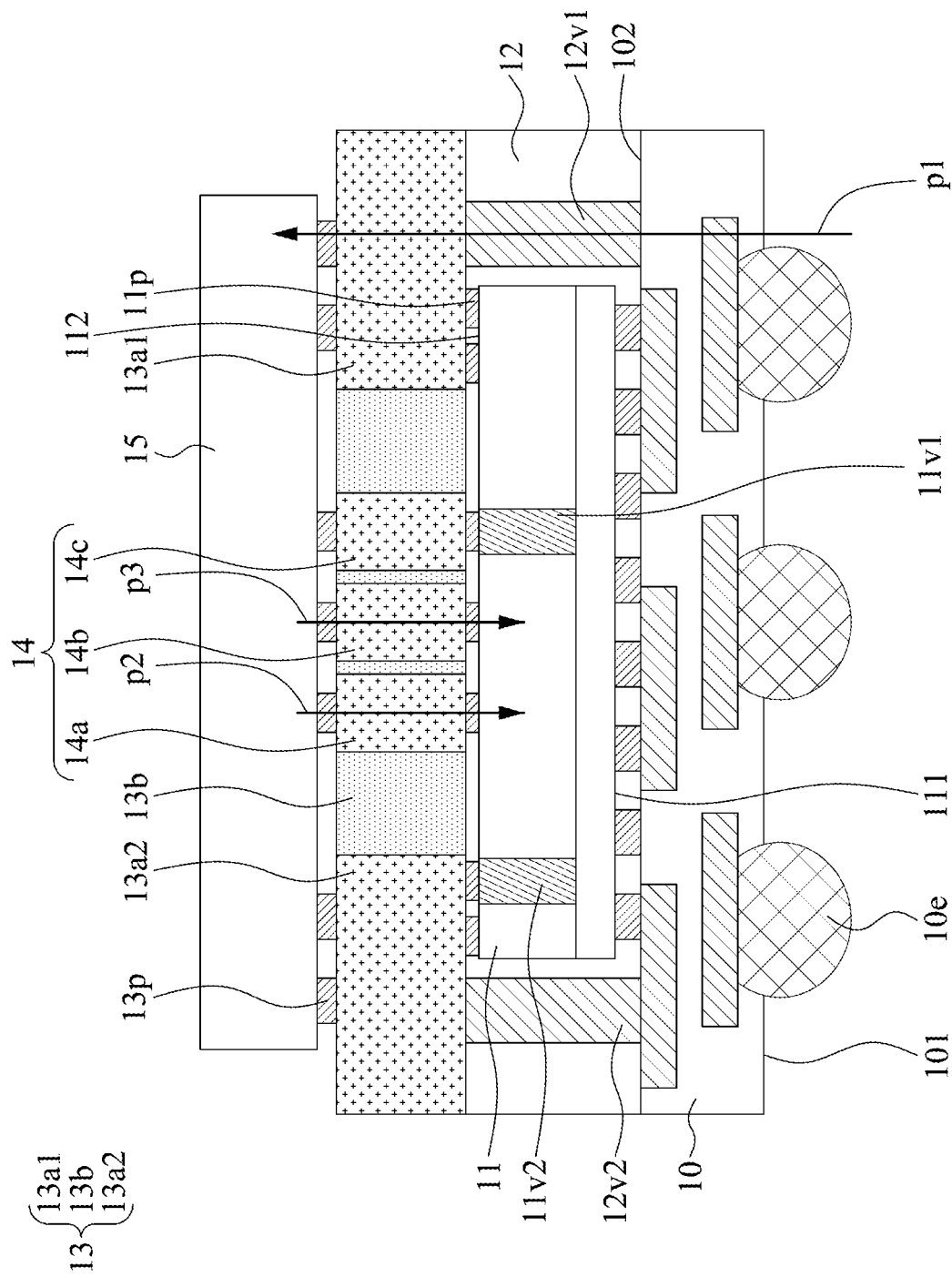
FIG. 2A illustrates a cross-sectional view of an example of an electronic device according to some embodiments of the present disclosure.

FIG. 2A illustrates a cross-sectional view of an example of an electronic device 2 according to some embodiments of the present disclosure. The electronic device 2 is similar to the electronic device 1 in FIG. 1A. Therefore, some detailed descriptions may refer to the corresponding paragraphs above and are not repeated hereinafter for conciseness.

In some embodiments, the conductive element 14 may include a plurality of lead pads 14a, 14b, and 14c. The lead pads 14a, 14b, and 14c may be spaced part from one another. In some embodiments, the power regulating component 15 may be configured to receive a power signal p1 from the patterned conductive element 13 and generate multiple power signals p2 and p3 for the active component 11 through the conductive element 14. For example, the power regulating component 15 may provide more than one kind or level of power. For example, the powers p2 and p3 may include different voltages. In some embodiments, the active component 11 may include a plurality of conductive vias (like the conductive vias 11v1), and each of the conductive vias may be connected with one of the lead pads of the conductive element 14. For example, one conductive via may be connected with one lead pad.

For example, the power signal p2 may be transmitted to the active component 11 through the lead pad 14a, and the power signal p3 may be transmitted to the active component 11 through the lead pad 14b.

Figure 2B:
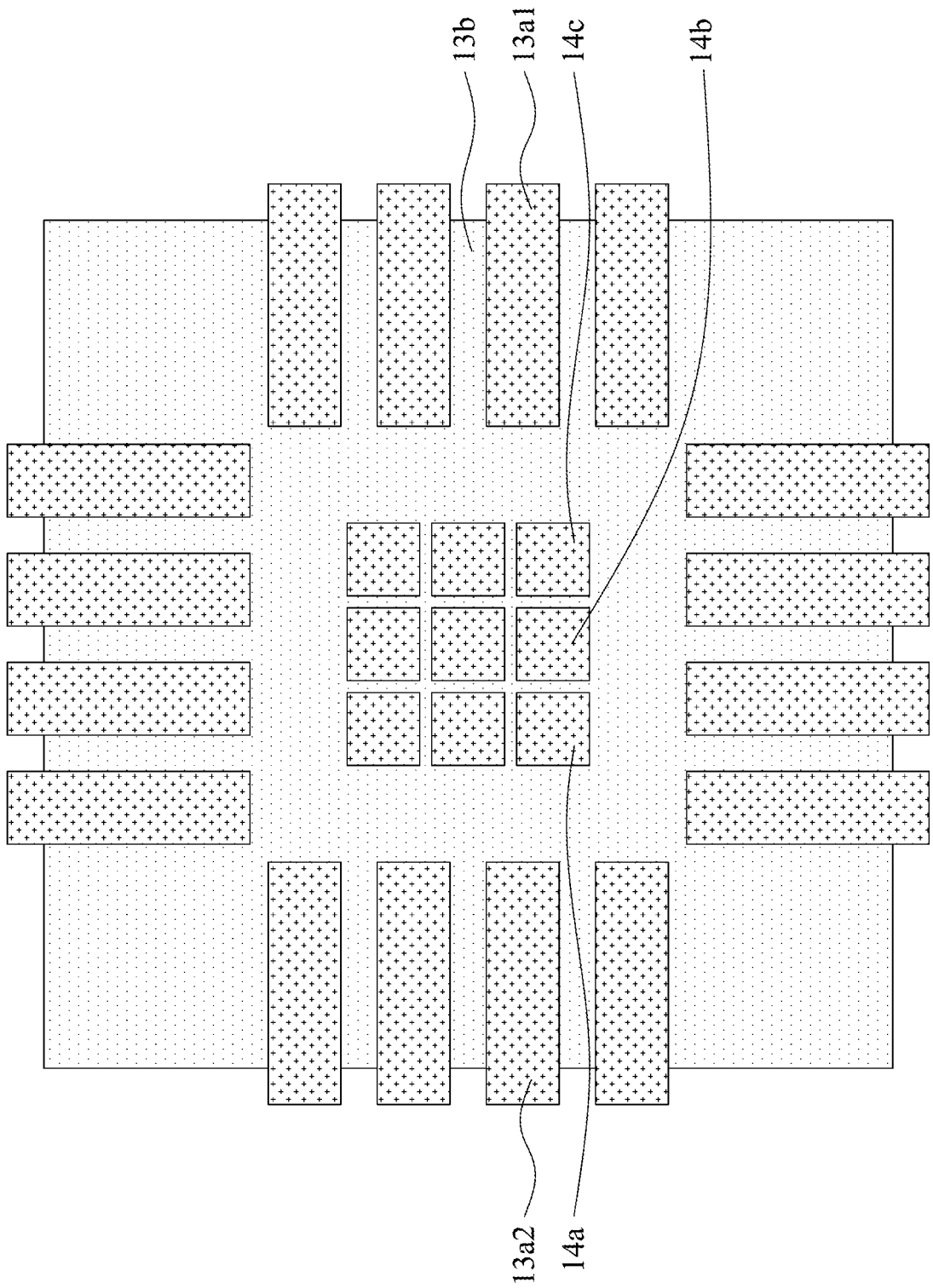
FIG. 2B illustrates a top view of an example of a part of an electronic device according to some embodiments of the present disclosure.

Referring to FIG. 2B, it illustrates a top view of an example of a part of an electronic device according to some embodiments of the present disclosure. In some embodiments, the top view of FIG. 2B may be a top view of the patterned conductive element 13 and the conductive element 14 of the electronic device 2.

In some embodiments, the patterned conductive element 13 may be a lead frame or a part thereof. The lead pads (including the conductive elements 13a1 and 13a2) arranged on the periphery of the insulating element 13b may be configured to transmit the power signal p1.

The lead pads 14a, 14b, and 14c of the conductive element 14 may be configured to transmit the power p2, the power p3, and other powers (if any). The conductive element 14 may include nine lead pads. Therefore, nine powers of different voltages may be provided from the power regulating component 15 to the active component 11 shown in FIG. 2A. In some embodiments, there may be any number of lead pads depending on design requirements. In some embodiments, the conductive element 14 and the conductive elements 13a1 and 13a2 may be made from the same material.

In some embodiments, the lead pads (including the conductive elements 13a1 and 13a2) may be configured to provide one or more heat dissipation paths for the active component 11 shown in FIG. 2A. The lead pads of the conductive element 14 may be configured to provide one or more power paths between the active component 11 and the power regulating component 15 shown in FIG. 2A. The one or more power paths may be disposed between the heat dissipation paths. The heat dissipation paths may be disposed around the one or more power paths. The insulating element (or the insulating layer) 13b may be disposed between one of the heat dissipation paths and one of the power paths. The insulating element (or the insulating layer) 13b may separate the heat dissipation paths from the power paths.

According to some embodiments of the present disclosure, by using the conductive element 14 with a plurality of lead pads, the power regulating component 15 can provide more than one kind or level of power for the active component 11. The power connections between the power regulating component 15 and the active component 11 can be more flexible.

Figure 3A:
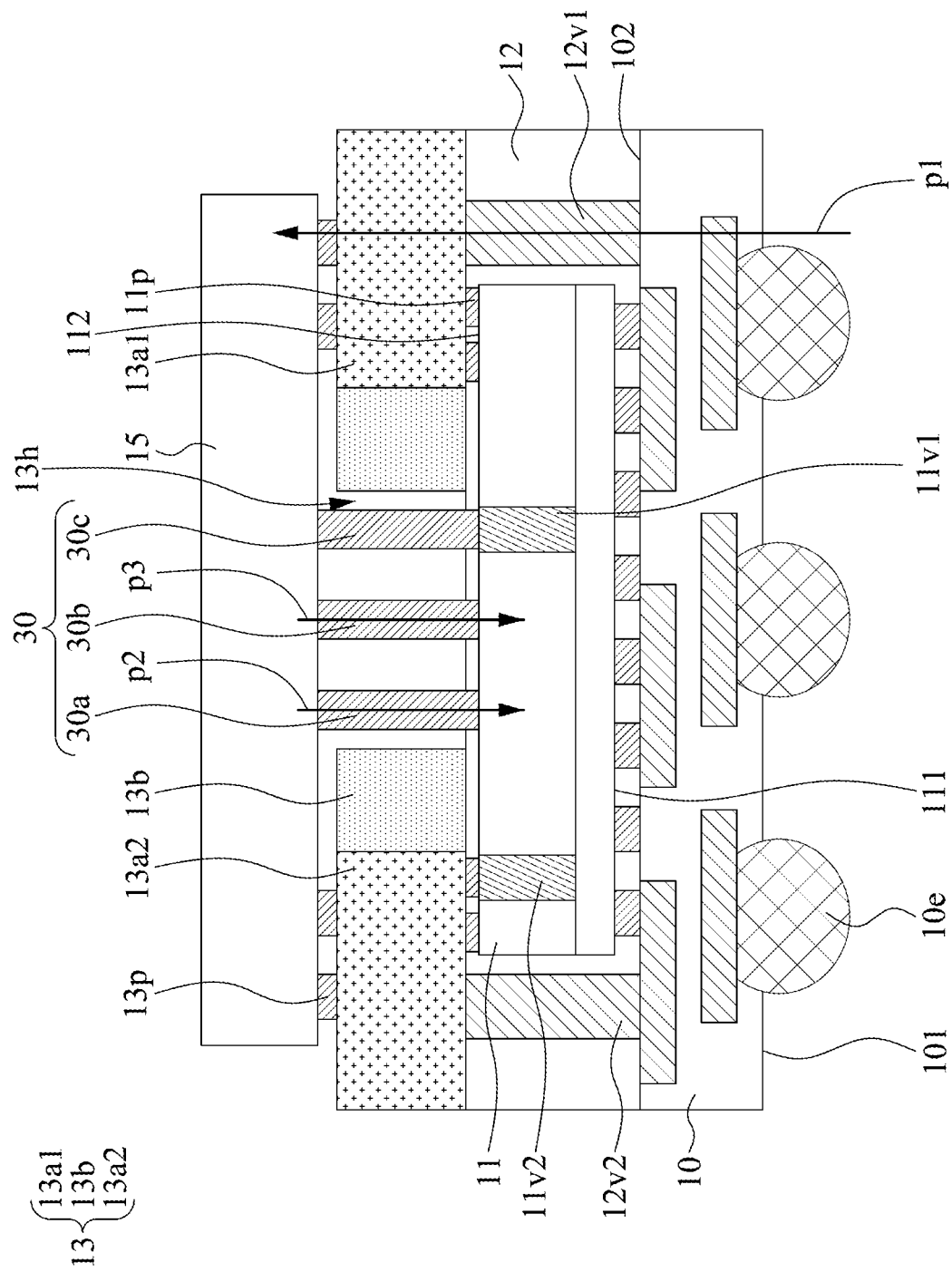
FIG. 3A illustrates a cross-sectional view of an example of an electronic device according to some embodiments of the present disclosure.

FIG. 3A illustrates a cross-sectional view of an example of an electronic device 3 according to some embodiments of the present disclosure. The electronic device 3 is similar to the electronic device 2 in FIG. 2A. Therefore, some detailed descriptions may refer to the corresponding paragraphs above and are not repeated hereinafter for conciseness.

The conductive element 14 of FIG. 2A may be replaced with a plurality of conductive elements 30a, 30b, and 30c (collectively referred to as a conductive element 30). The conductive elements 30a, 30b, and 30c may be spaced part from one another. The conductive elements 30a, 30b, and 30c may each include a wire bond (also illustrated in FIGS. 6 and 7), a conductive pillar, or a wire (such as a vertical wire). The conductive elements 30a, 30b, and 30c may each include a monolithic piece. The conductive elements 30a, 30b, and 30c may each have a constant width. For example, the conductive element 14 of FIG. 2A may be replaced with a patterned pillar.

The insulating element 13b may define a through hole (or an opening) 13h and the conductive element 30 may be disposed within the through hole 13h. The conductive element 30 may be spaced apart from the insulating element 13b. The conductive element 30 may be physically separated from the insulating element 13b. The insulating element 13b may not contact the patterned conductive element 13.

In some embodiments, the conductive element 30 and the patterned conductive element 13 may include different materials. For example, the conductive element 30 and the patterned conductive element 13 may include materials having different conductivities. For example, the conductivity of the conductive element 30 may be greater than the conductivity of the patterned conductive element 13 by more than two times. For example, the conductive element 30 may include copper (Cu).

Figure 3B:
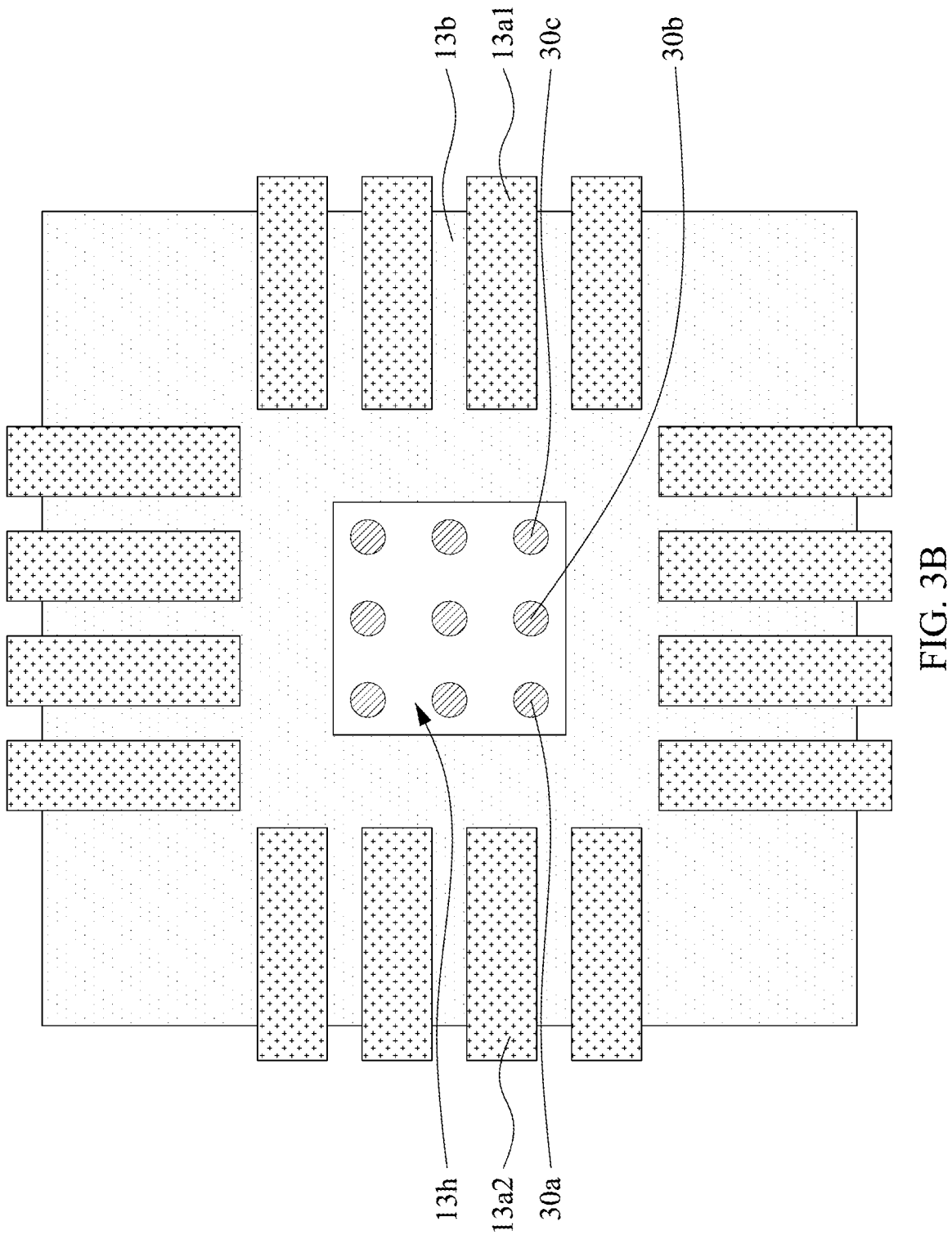
FIG. 3B illustrates a top view of an example of a part of an electronic device according to some embodiments of the present disclosure.

Referring to FIG. 3B, it illustrates a top view of an example of a part of an electronic device according to some embodiments of the present disclosure. In some embodiments, the top view of FIG. 3B may be a top view of the patterned conductive element 13 and the conductive element 30 of the electronic device 3.

In some embodiments, the patterned conductive element 13 may be a lead frame or a part thereof. The lead pads (including the conductive elements 13a1 and 13a2) arranged on the periphery of the insulating element 13b may be configured to transmit the power signal p1. The conductive elements 30a, 30b, and 30c (surrounded by the lead pads) of the conductive element 30 may be configured to transmit the power signal p2, the power signal p3, and other power signals (if any). In some embodiments, there may be any number of conductive element 30 depending on design requirements.

According to some embodiments of the present disclosure, by replacing the conductive element 14 with the conductive element 30 having a higher conductivity, the voltage drop of the power path and the signal loss can be decreased without compromising the heat dissipation capacity.

Figure 4:
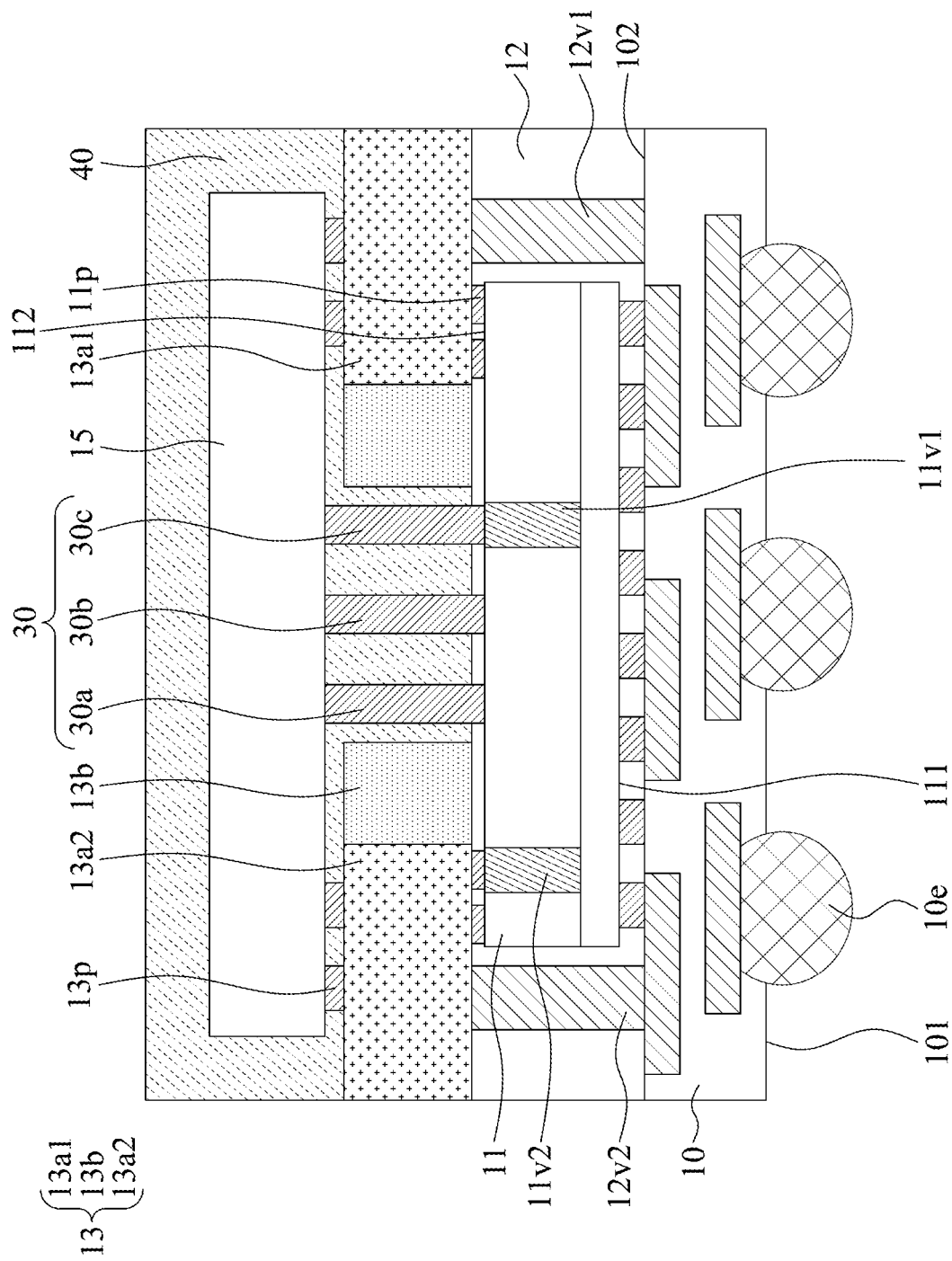
FIG. 4 illustrates a cross-sectional view of an example of an electronic device according to some embodiments of the present disclosure.

FIG. 4 illustrates a cross-sectional view of an example of an electronic device 4 according to some embodiments of the present disclosure. The electronic device 4 is similar to the electronic device 3 in FIG. 3A. Therefore, some detailed descriptions may refer to the corresponding paragraphs above and are not repeated hereinafter for conciseness.

The electronic device 4 may include an encapsulant 40 disposed on the power regulating component 15 and the patterned conductive element 13. The encapsulant 40 may be disposed within the through hole 13h (shown in FIG. 3A) defined by the patterned conductive element 13. The encapsulant 40 may cover or surround the conductive element 30. For example, the conductive element 30 may penetrate a part of the encapsulant 40. The encapsulant 40 may protect and provide structural support for the conductive element 30.

Figure 5A:
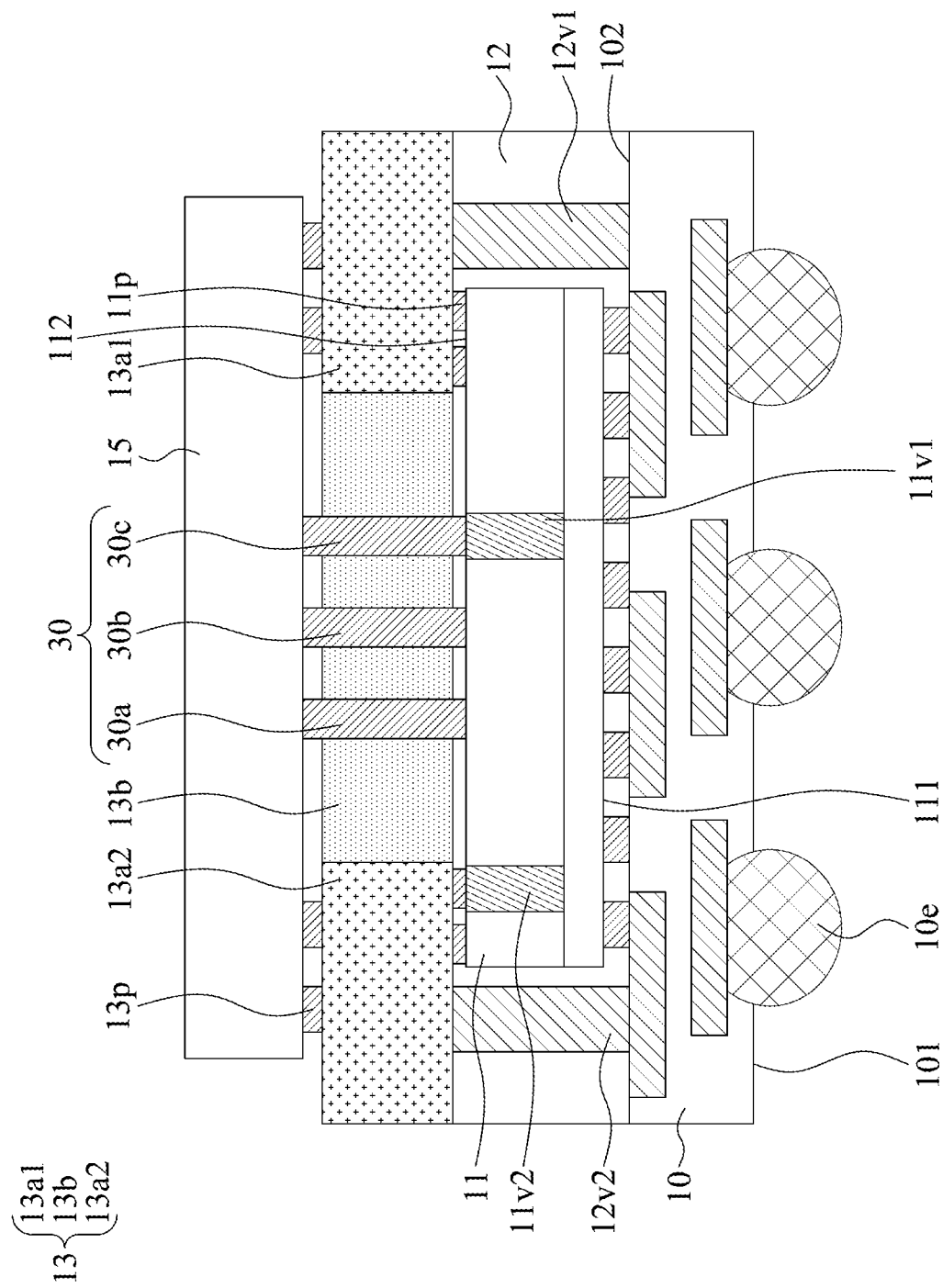
FIG. 5A illustrates a cross-sectional view of an example of an electronic device according to some embodiments of the present disclosure.

FIG. 5A illustrates a cross-sectional view of an example of an electronic device 5 according to some embodiments of the present disclosure. The electronic device 5 is similar to the electronic device 3 in FIG. 3A. Therefore, some detailed descriptions may refer to the corresponding paragraphs above and are not repeated hereinafter for conciseness.

The conductive element 30 of the electronic device 5 may be covered or surrounded by the insulating element 13b. For example, the conductive element 30 of the electronic device 5 may penetrate through the insulating element 13b. For example, the conductive element 30 of the electronic device 5 may be exposed from the insulating element 13b to contact the power regulating component 15. The insulating element 13b may protect and provide structural support for the conductive element 30.

Figure 5B:
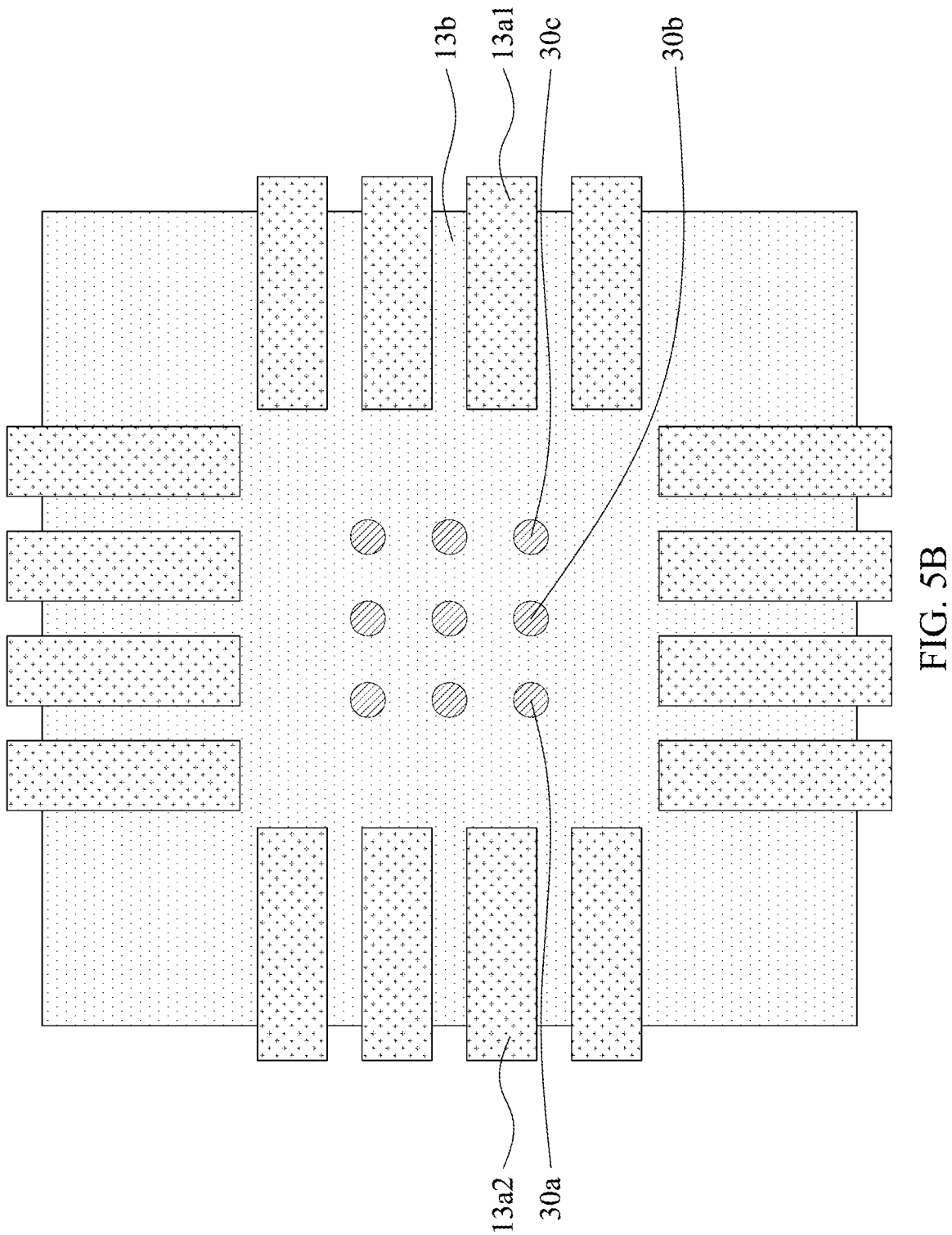
FIG. 5B illustrates a top view of an example of a part of an electronic device according to some embodiments of the present disclosure.

Referring to FIG. 5B, it illustrates a top view of an example of a part of an electronic device according to some embodiments of the present disclosure. In some embodiments, the top view of FIG. 5B may be a top view of the patterned conductive element 13 and the conductive element 30 of the electronic device 5.

In comparison with the top view of FIG. 3B, the patterned conductive element 13 does not define a through hole 13h. The conductive elements 30a, 30b, and 30c may be attached, connected, or combined with one another through an insulating element 13b.

Figure 6:
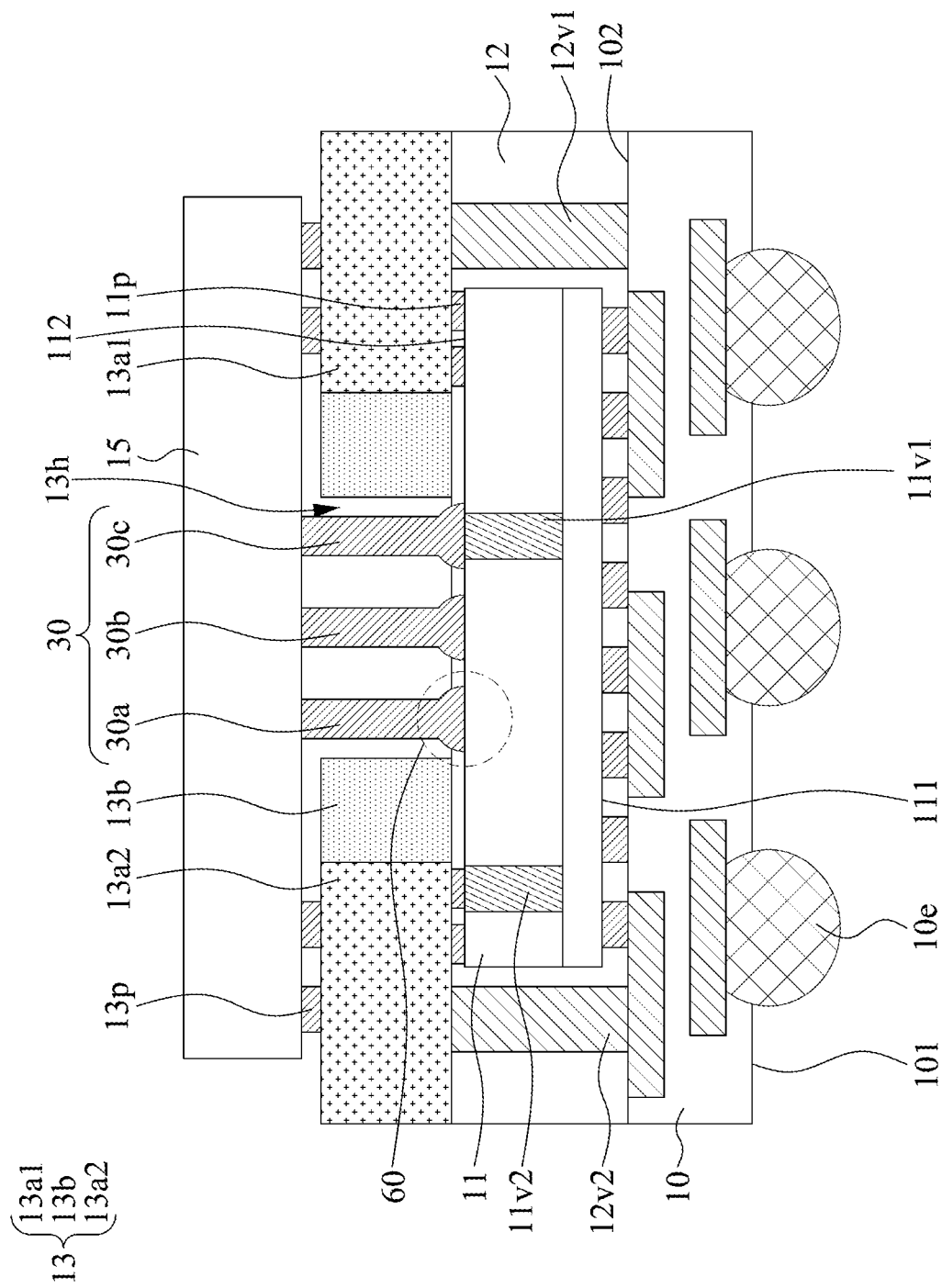
FIG. 6 illustrates a cross-sectional view of an example of an electronic device according to some embodiments of the present disclosure.

FIG. 6 illustrates a cross-sectional view of an example of an electronic device 6 according to some embodiments of the present disclosure. The electronic device 6 is similar to the electronic device 3 in FIG. 3A. Therefore, some detailed descriptions may refer to the corresponding paragraphs above and are not repeated hereinafter for conciseness.

The conductive element 30 of the electronic device 6 may include a wire bond. The conductive elements 30a, 30b, and 30c may each include a stud bump 60 adjacent to the active component 11. The stud bump 60 may contact the surface 112 of the active component 11. The stud bump 60 may have the greatest width of the conductive elements 30a, 30b, and 30c. The stud bump 60 may tapper from the active component 11.

Figure 7:
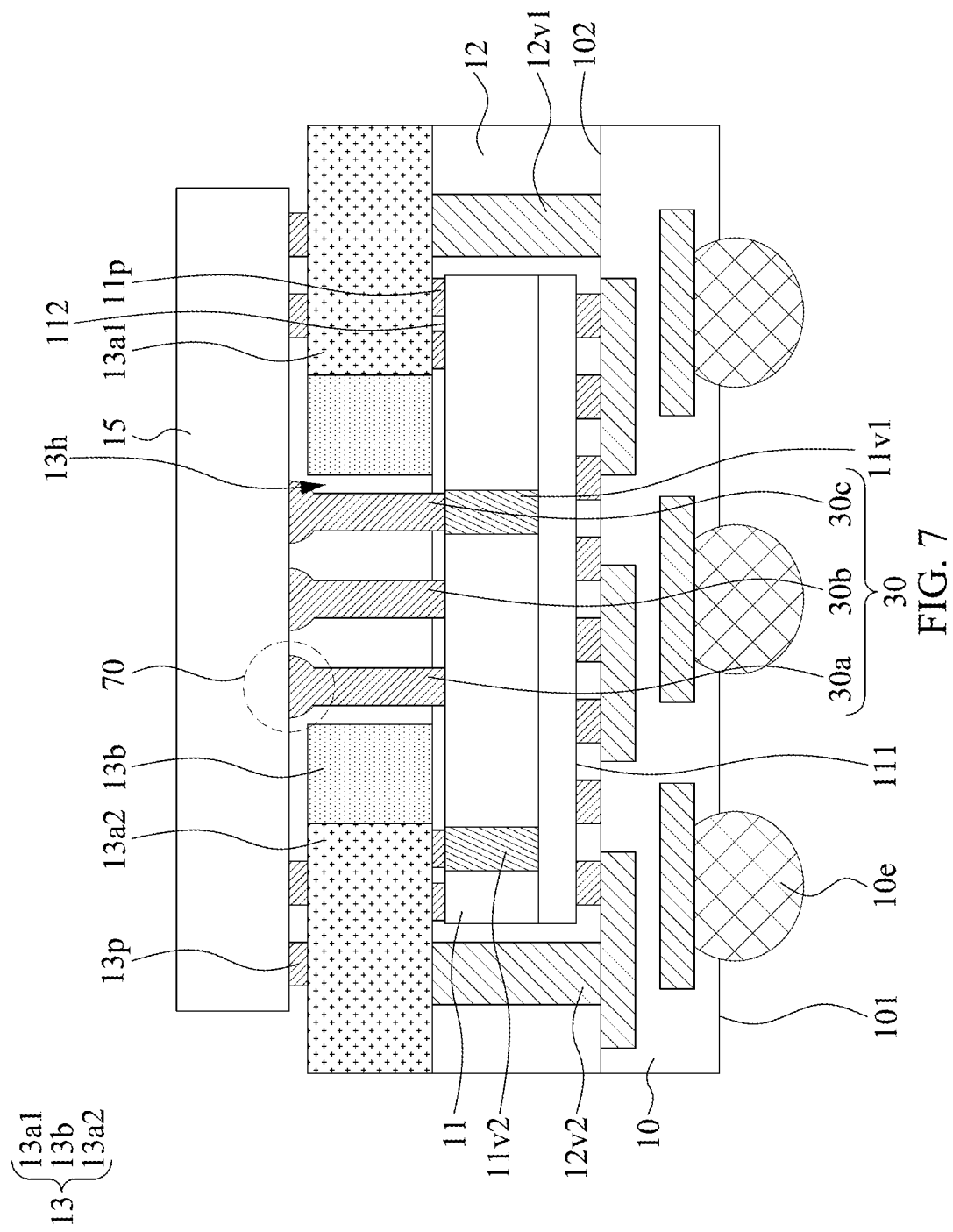
FIG. 7 illustrates a cross-sectional view of an example of an electronic device according to some embodiments of the present disclosure.

FIG. 7 illustrates a cross-sectional view of an example of an electronic device 7 according to some embodiments of the present disclosure. The electronic device 7 is similar to the electronic device 3 in FIG. 3A. Therefore, some detailed descriptions may refer to the corresponding paragraphs above and are not repeated hereinafter for conciseness.

The conductive elements 30a, 30b, and 30c may each include a stud bump 70 adjacent to the power regulating component 15. The stud bump 70 may contact a surface of the power regulating component 15 facing the active component 11. The stud bump 70 may tapper from the power regulating component 15.

FIGS. 8A, 8B, 8C, 8D, and 8E illustrate cross-sectional views in one or more stages of a method of manufacturing a part of an electronic device in accordance with an embodiment of the present disclosure. At least some of these figures have been simplified to better understand the aspects of the present disclosure. In some embodiments, a part of the electronic devices 3, 4, 5, and 6 may be manufactured through the operations described with respect to FIGS. 8A, 8B, 8C, 8D, and 8E.

Figure 8A:
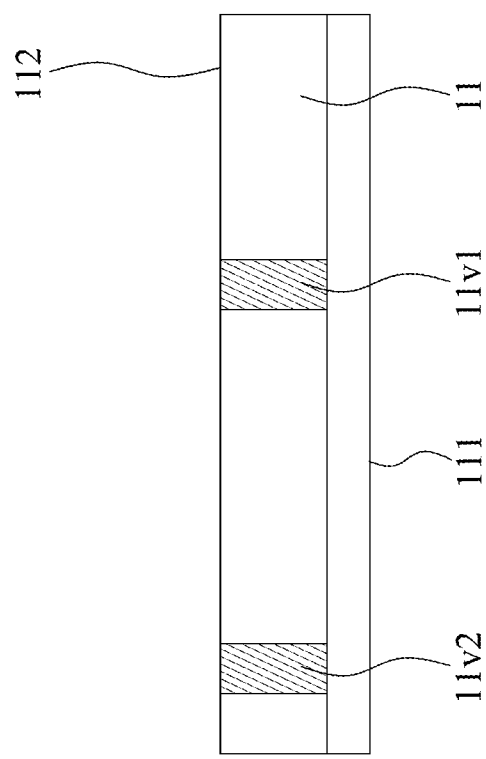
FIGS. 8A, 8B, 8C, 8D, and 8E illustrate cross-sectional views in one or more stages of a method of manufacturing a part of an electronic device in accordance with an embodiment of the present disclosure.

Referring to FIG. 8A, the active component 11 may be provided. The surface 111 of the active component 11 may include an active surface and the surface 112 of the active component 11 may include a backside surface. The active component 11 may include one or more conductive vias 11v1 and 11v2 extending between the surface 111 and the surface 112.

Figure 8B:
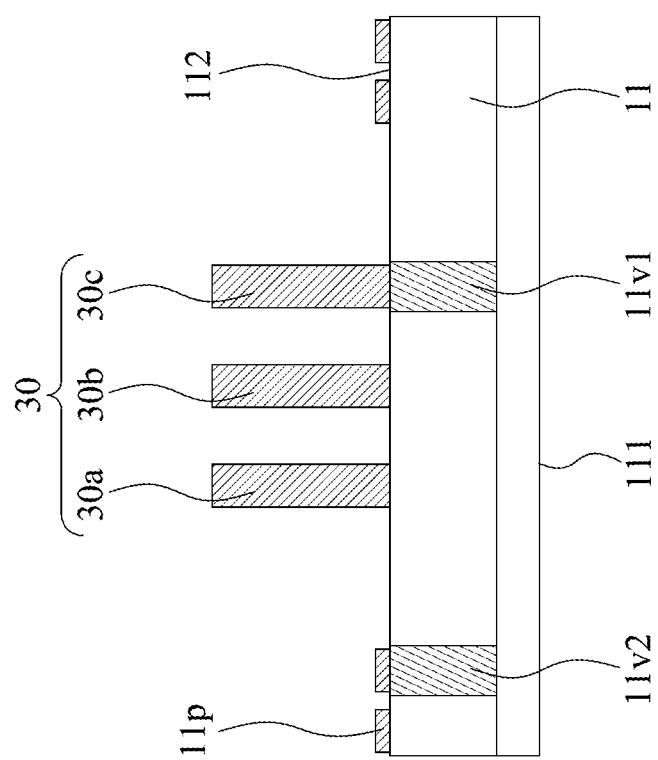

Referring to FIG. 8B, the conductive elements 30a, 30b, and 30c may be provided on the surface 112 of the active component 11. One or more conductive pads 11p may be provided on the surface 112 of the active component 11.

In some other embodiments, the conductive elements 30a, 30b, and 30c may be formed by a wire bonding process, and a stud bump (such as the stud bump 60 shown in FIG. 6) may be formed adjacent to the active component 11.

Figure 8C:
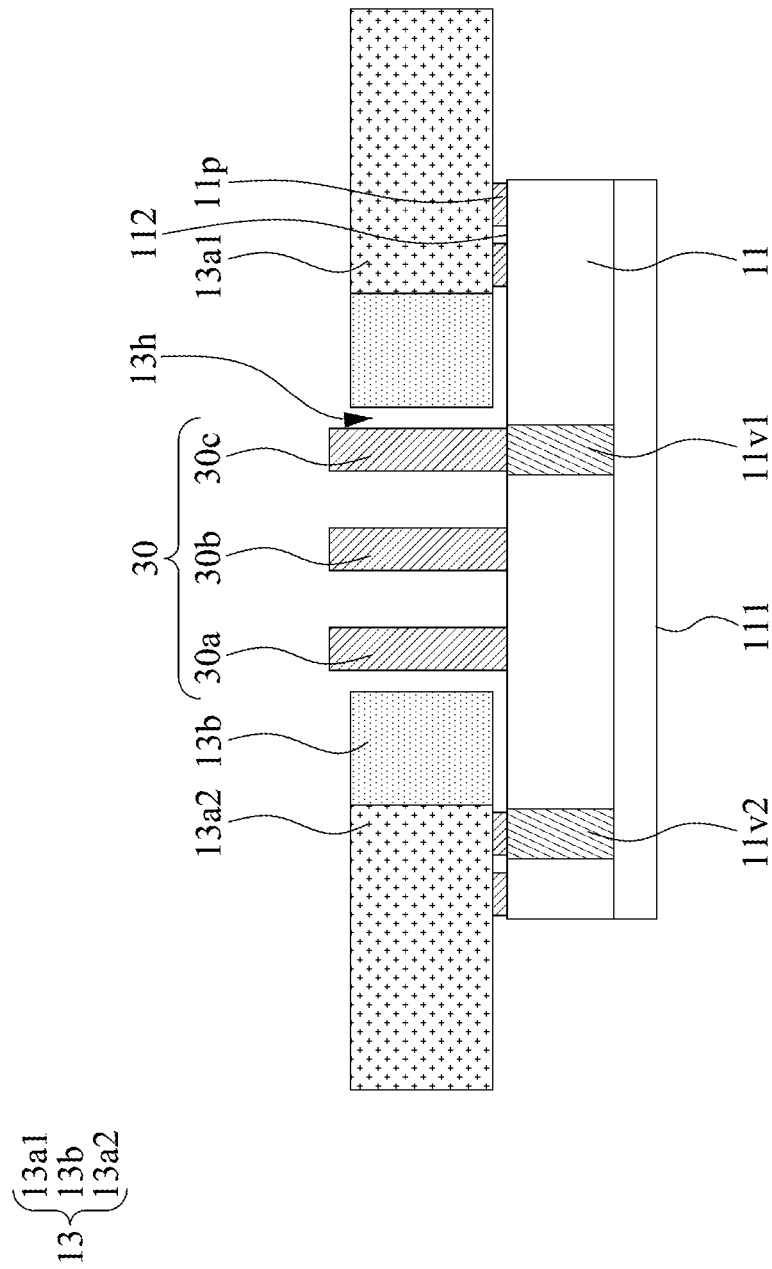

Referring to FIG. 8C, the patterned conductive element 13 may be provided on the active component 11. The patterned conductive element 13 may be electrically connected with the active component 11 through the conductive pads 11p. The patterned conductive element 13 may define a through hole 13h for accommodating the conductive elements 30a, 30b, and 30c.

In some other embodiments, the patterned conductive element 13 may not define a through hole, and the conductive elements 30a, 30b, and 30c may penetrate through the insulating material 13b as shown in FIGS. 5A and 5B.

Figure 8D:
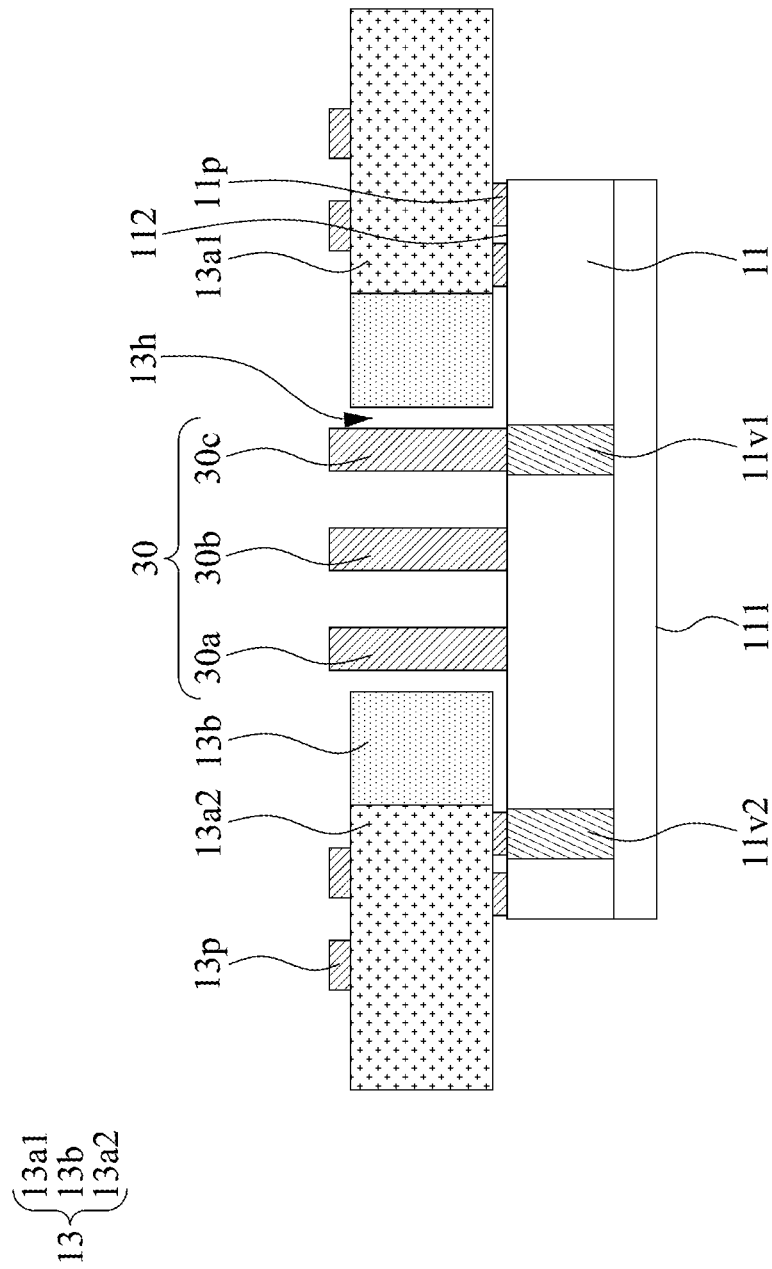

Referring to FIG. 8D, one or more conductive pads 13p may be provided on a surface of the patterned conductive element 13 facing away from the active component 11.

Figure 8E:
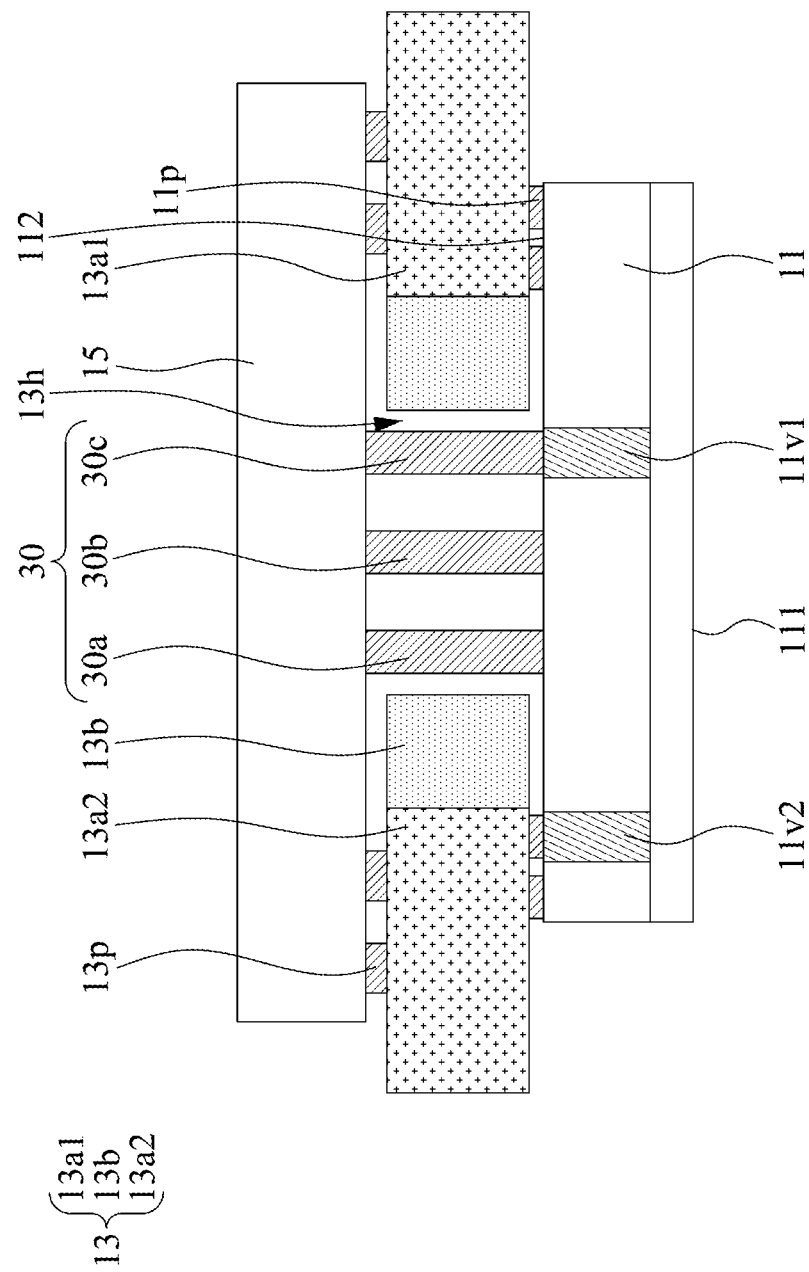

Referring to FIG. 8E, the power regulating component 15 may be provided on the patterned conductive element 13. The power regulating component 15 may be electrically connected with the patterned conductive element 13 through the conductive pads 13p. The power regulating component 15 may be electrically connected with the active component 11 through the conductive elements 30a, 30b, and 30c.

FIGS. 9A, 9B, 9C, and 9D illustrate cross-sectional views in one or more stages of a method of manufacturing a part of an electronic device in accordance with an embodiment of the present disclosure. At least some of these figures have been simplified to better understand the aspects of the present disclosure. In some embodiments, a part of the electronic devices 3, 4, 5, and 7 may be manufactured through the operations described with respect to FIGS. 9A, 9B, 9C, and 9D.

Figure 9A:
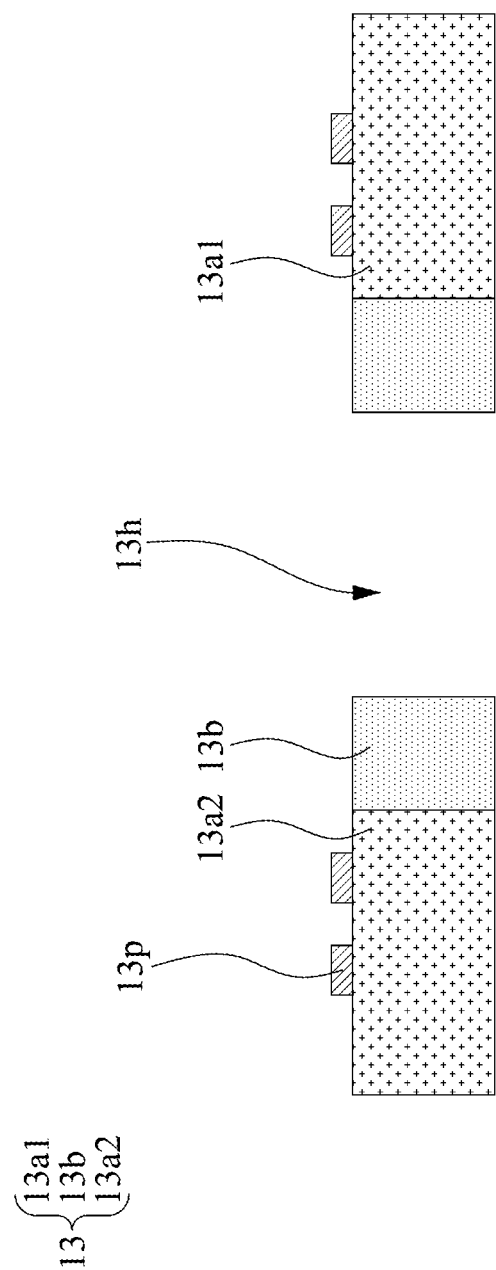
FIGS. 9A, 9B, 9C, and 9D illustrate cross-sectional views in one or more stages of a method of manufacturing a part of an electronic device in accordance with an embodiment of the present disclosure.

Referring to FIG. 9A, the patterned conductive element 13 may be provided. The patterned conductive element 13 may include the conductive elements 13a1 and 13a2 supported by the insulating material 13b. One or more conductive pads 13p may be provided on a surface of the patterned conductive element 13 The patterned conductive element 13 may define a through hole 13h for accommodating the conductive elements 30a, 30b, and 30c.

In some other embodiments, the patterned conductive element 13 may not define a through hole, and the conductive elements 30a, 30b, and 30c may penetrate through the insulating material 13b as shown in FIGS. 5A and 5B.

Figure 9B:
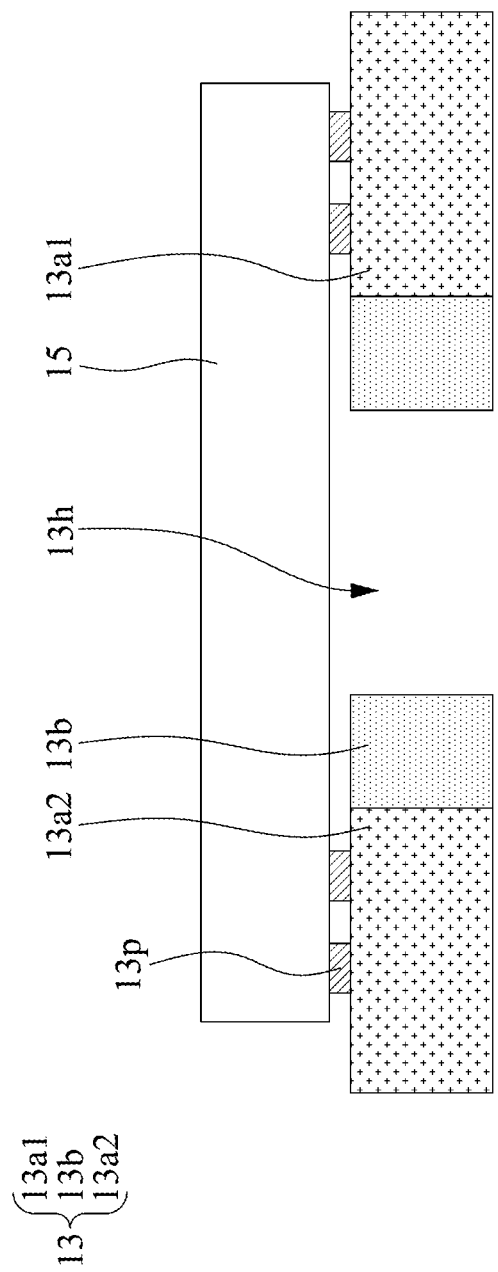

Referring to FIG. 9B, the power regulating component 15 may be provided on the patterned conductive element 13. The power regulating component 15 may be electrically connected with the patterned conductive element 13 through the conductive pads 13p.

Figure 9C:
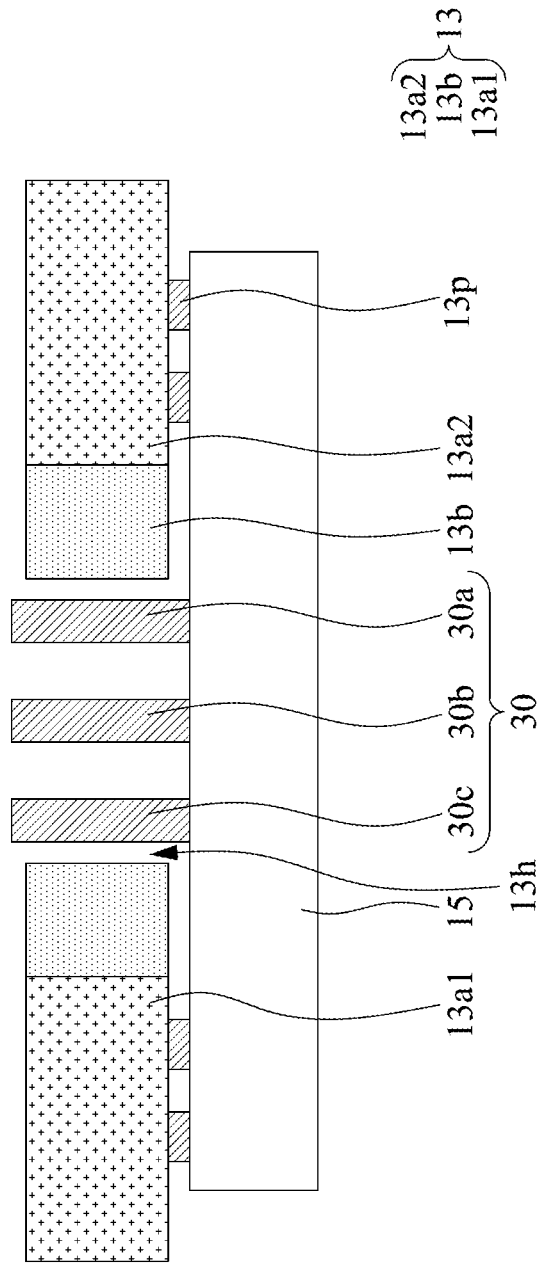

Referring to FIG. 9C, the structure from FIG. 8B may be upside down. The conductive elements 30a, 30b, and 30c may be provided on a surface of the power regulating component 15.

In some other embodiments, the conductive elements 30a, 30b, and 30c may be formed by a wire bonding process, and a stud bump (such as the stud bump 70 shown in FIG. 7) may be formed adjacent to the power regulating component 15.

Figure 9D:
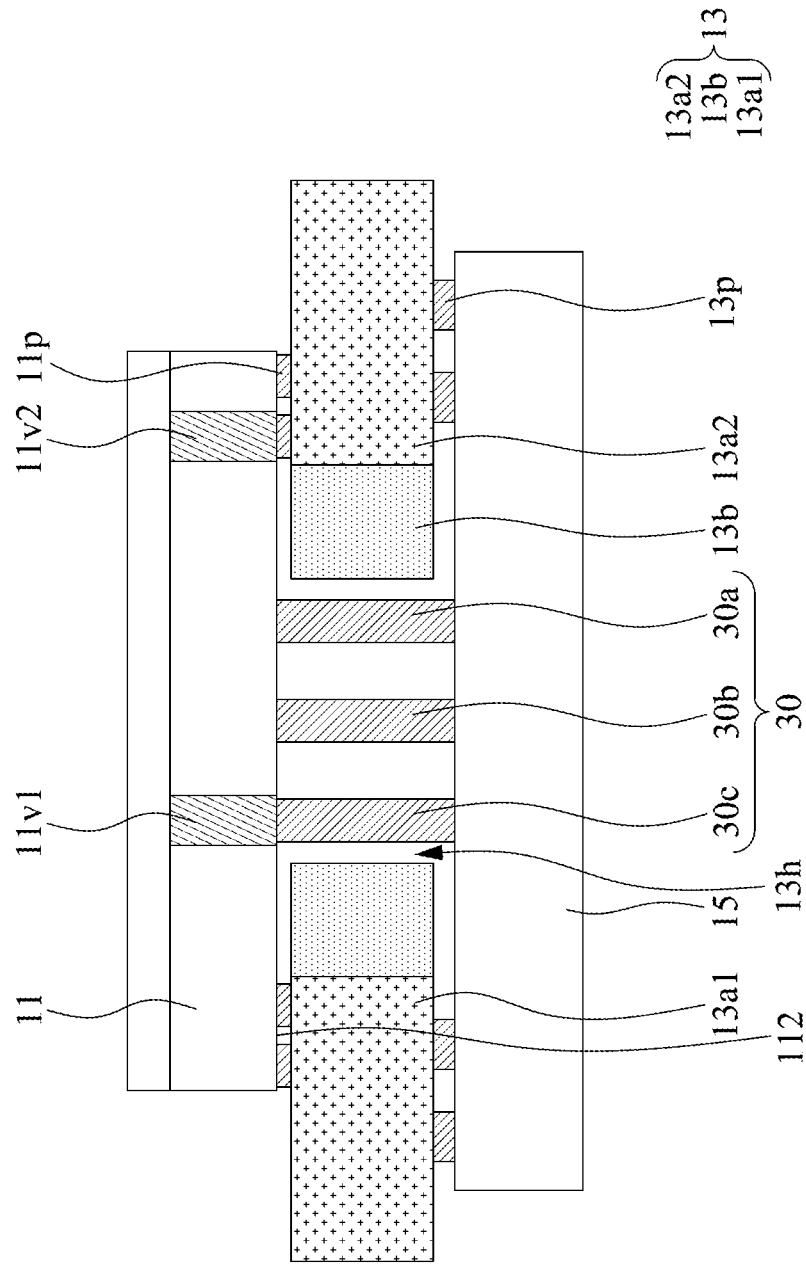

Referring to FIG. 9D, one or more conductive pads 11p may be provided on the patterned conductive element 13. The active component 11 may be provided on the patterned conductive element 13. The active component 11 may be electrically connected with the patterned conductive element 13 through the conductive pads 11p. The active component 11 may be electrically connected with the power regulating component 15 through the conductive elements 30a, 30b, and 30c.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   an active component;
   a power regulating component disposed on the active component;
   a heat dissipation element disposed between the active component and the power regulating component and configured to provide heat dissipation for the active component; and
   a conductive element physically spaced apart from the heat dissipation element and configured to provide multiple power signals from the power regulating component to the active component,
   wherein the multiple power signals includes first power and second power different from the first power.

2. The electronic device of claim 1, wherein the conductive element comprises a plurality of conductive components arranged in an array.

3. The electronic device of claim 1, wherein the conductive element comprises a plurality of conductive components and the active component comprises a plurality of conductive vias, and wherein each of the plurality of conductive vias is connected with one of the plurality of conductive components.

4. The electronic device of claim 3, wherein the plurality of conductive vias are exposed from a backside surface of the active component.

5. An electronic device, comprising:
   an active component;
   a power regulating component disposed on the active component; and
   a lead frame disposed between the active component and the power regulating component,
   wherein the power regulating component is configured to provide power to the active component through the lead frame and a backside surface of the active component,
   wherein the lead frame is configured to transmit a first power to the power regulating component, and the power regulating component is configured to generate a second power and a third power and to transmit the second power and the third power to the active component through the lead frame.

6. The electronic device of claim 5, further comprising:
   a carrier disposed below the active component; and
   a conductive via connecting between the carrier and the lead frame, wherein the carrier is configured to provide power to the lead frame through the conductive via.

7. The electronic device of claim 6, further comprising:
   an insulating element covering the lead frame; and
   an encapsulant covering the active component and the conductive via and connected with the insulating element.

* * * * *